(12) United States Patent
Huang et al.

(10) Patent No.: US 8,722,312 B2
(45) Date of Patent: May 13, 2014

(54) METHOD FOR FABRICATING SEMICONDUCTOR NANO CIRCULAR RING

(75) Inventors: Ru Huang, Beijing (CN); Yujie Al, Beijing (CN); Zhihua Hao, Beijing (CN); Shuangshuang Pu, Beijing (CN); Jiewen Fan, Beijing (CN); Shuai Sun, Beijing (CN); Runsheng Wang, Beijing (CN); Xia An, Beijing (CN)

(73) Assignee: Peking University, Beijing (CN)

( * ) Notice: Subject to any disclaimer, the term of this patent is extended or adjusted under 35 U.S.C. 154(b) by 319 days.

(21) Appl. No.: 13/379,752

(22) PCT Filed: Sep. 9, 2011

(86) PCT No.: PCT/CN2011/079525
§ 371 (c)(1),
(2), (4) Date: Dec. 21, 2011

(87) PCT Pub. No.: WO2012/045258
PCT Pub. Date: Apr. 12, 2012

(65) Prior Publication Data
US 2012/0190202 A1 Jul. 26, 2012

(30) Foreign Application Priority Data
Oct. 9, 2010 (CN) .......................... 2010 1 0506128

(51) Int. Cl.
*G03F 7/20* (2006.01)
(52) U.S. Cl.
USPC ....................................................... 430/313
(58) Field of Classification Search
CPC . H01L 21/3065; G03F 7/0236; G03F 7/2004; G03F 7/30; G03F 7/42
USPC ............................................ 430/311, 313, 320
See application file for complete search history.

(56) References Cited

U.S. PATENT DOCUMENTS

2008/0187843 A1  8/2008  Ishiwata

FOREIGN PATENT DOCUMENTS

| CN | 1483661 A | 3/2004 |
| CN | 1710449 A | 12/2005 |
| CN | 1966397 A | 5/2007 |
| CN | 101345274 A | 1/2009 |
| EP | 1158361 A1 | 11/2001 |

OTHER PUBLICATIONS

G. Pennelli, Top down fabrication of long silicon nanowire devices by means of lateral oxidation, Microelectronic Engineering, vol. 86, 2009, pp. 2139-2143.

*Primary Examiner* — Brittany Raymond
(74) *Attorney, Agent, or Firm* — McDermott Will & Emery LLP

(57) ABSTRACT

The present invention discloses a method for fabricating a semiconductor nano circular ring. In the method, firstly, a positive photoresist is coated on a semiconductor substrate, then the photoresist is exposed by using a circular mask with a micrometer-sized diameter to obtain the circular ring-shaped photoresist, based on the poisson diffraction principle. Then, a plasma etching is performed on the substrate under a protection of the circular ring-shaped photoresist to form a circular ring-shaped structure with a nano-sized wall thickness on a surface of the substrate. The embodiment of present invention fabricates a nano-sized circular ring-shaped structure by using a micrometer-sized lithography equipment and a micrometer-sized circular mask, and overcomes the dependence on advanced technologies, so as to effectively reduce the fabrication cost of the circular ring-shaped nano structure.

7 Claims, 1 Drawing Sheet

METHOD FOR FABRICATING SEMICONDUCTOR NANO CIRCULAR RING

CROSS REFERENCE TO PRIOR APPLICATIONS

This application is a U.S. National Phase application under 35 U.S.C. §371 of International Application No. PCT/CN2011/079,525, tiled on Sep. 9, 2011 and claims benefit of priority to Chinese Patent Application No. 201010506128.7, filed on Oct. 9, 2010. The contents of the applications are hereby incorporated by reference.

FIELD OF THE INVENTION

The invention relates a method for processing semiconductor nano material, and particularly relates to a method for fabricating a nano-sized circular ring structure of semiconductor material.

BACKGROUND OF THE INVENTION

A nano-sized circular ring structure demonstrates important application prospects in the semiconductor field. For example, for a solar cell of vertical structure, the circular ring structure can absorb photo-generated carriers more effectively than a columnar structure, thus improving efficiency of the cell. In a field of LED, researchers usually increase the light-emission efficiency by employing a pattern substrate technology, and as compared with a typical sapphire pattern substrate of columnar structure, a pattern substrate of circular ring structure can increase the light reflection more effectively, and it is hopeful to enable the LED obtain higher light-emission efficiency.

Due to the limitation by the minimum line width of optical lithography, it is very difficult to fabricate the nano-sized circular ring structure by a conventional optical lithography. The fabrication of the nano-sized circular ring often depends on advanced and expensive processing technologies such as the electron beam lithography, the focusing ion beam lithography etc., which certainly increases the product fabrication cost. Of course, the nano-sized circular ring structure may be self-assembly fabricated based on a chemical growth technology, such as a growth mechanism based on Vapor-Liquid-Solid. However, it is difficult to ensure consistency and uniformity of the nano structure by using the self-assembly technology. Moreover, as compared with nanowire fabrication, the technology for self-assembly fabricating a nano-sized circular ring structure is less mature.

SUMMARY OF THE INVENTION

For the above problems, an object of the present invention is to provide a method for fabricating a nano-sized circular ring structure of semiconductor material with a low cost by using a micrometer-sized lithography equipment based on the basic principle of Poisson Diffraction.

In order to achieve the above object, the present invention adopts the following technical solution.

A method for fabricating a semiconductor nano circular ring includes the following steps:
1) cleaning a semiconductor substrate and pre-baking the substrate;
2) spin-coating a positive photoresist on the substrate;
3) exposing the photoresist under a protection of a mask, wherein a pattern region of the mask is a circle with a micrometer-sized diameter;
4) developing the exposed photoresist to form a circular ring-shaped photoresist on the substrate, and then post-baking the substrate;
5) performing a plasma etching on the substrate under a protection of the circular ring-shaped photoresist;
6) removing and cleaning the photoresist to form a circular ring-shaped structure in which a thickness of the wall is nano-sized on a surface of the substrate.

The method of the present invention is based on the Poisson Diffraction principle, that is, when a light illuminates a small opaque circular plate, a bright spot, which is a so-called poisson bright spot, may occur in the center of a shadow of the circular plate. In the above step 3), since the pattern region of the mask is an opaque circle, in order for the occurring of the poisson bright spot phenomenon during exposing so that the corresponding photoresist region under the center of the opaque circular mask is also exposed to ensure that a circular ring shaped photoresist but not a circle shaped photoresist is left on the substrate after the developing, the diameter of the circle should not be too large and it is needed to be selected according to the wavelength of the exposure light. Meanwhile, the diameter of the circle is further limited by the sensitivity of the photoresist. If the diameter is too small, the photoresist may completely disappear after being developed. After the photoresist is selected, those skilled in the art may determine the matched wavelength and circle diameter by finite numbers of experiments. For example, as for positive photoresist (such as RZJ 304-25 from Ruihong Electronic Chemical Company, China), the ultraviolet exposure is performed by a ultraviolet lithography equipment, and the diameter of the circle of the mask should be in a range of 1 µm<d<2 µm.

In the above step 1), the material of the substrate may be a typical semiconductor material in the field of microelectronics and optoelectronics, for example the material that is usually used as a device substrate such as Si, Ge, GaAs, etc., and may also be various epitaxially grown semiconductor materials such as GaN, etc..

In the above step 2), the employed positive photoresist may be positive photoresist RZJ 304-25, AR-P 3100, AR-P 3200, AR-P 3500, AR-P 5900/4, etc., for example. The thickness of the photoresist is preferably 300 nanometers-4 micrometers, and more preferably is 1 micrometers-3 micrometers.

In the above step 4), it is preferred to use an ultraviolet light with a wavelength of 10 nm-400 nm to perform the exposure, and the diameter d of the circle of the mask is 1 µm<d<2 µm. In such a condition, the outer diameter of the semiconductor circular ring formed in the step 6) is 1.5 micrometers-2 micrometers, and the thickness of the wall of the ring (i.e. the difference between the outer diameter and the inner diameter) is about 80 nanometers-120 nanometers.

The technical solution of the present invention has the following advantages. 1. Due to the limitation of the sensitivity of photoresist, it is impossible to fabricate a nano structure based on a micrometer-sized lithography equipment through using a nano-sized mask pattern directly, whereas embodiments of the present invention use the Poisson Diffraction principle, which employs a micrometer-sized lithography equipment and a micrometer-sized circular mask to fabricate a nano-sized circular ring-shape structure, and overcome the dependence on advanced technologies so as to reduce the fabrication cost of the nano structure effectively. 2. The technology of embodiments of the present invention is scalable, that is, based on the poisson bright spot phenomenon, circular ring structures of various semiconductor materials having nano-sized ring thicknesses and diameters i.e. nanotube structures, may be fabricated by using a shorter wavelength, a circular mask with a smaller diameter and a photoresist with a higher sensitivity, thus overcoming the difficulty of fabricating nanotubes of various semiconductor materials, and providing a foundation for the research of the peculiar characteristics of nanotubes of various semiconductor materials.

BRIEF DESCRIPTION OF THE DRAWINGS

FIGS. 2(a) and 2(b) are scanning electron microscope photographs of a nano-sized circular ring structure fabricated on a Si substrate, wherein FIG. 2(a) is a top view and FIG. 2(b) is a side view of 45 degrees.

DETAILED DESCRIPTION OF THE EMBODIMENTS

The present invention is described in more detail through embodiments with reference to the drawings, but the scope of the present invention is not limited by this in any way.

Figure 1:
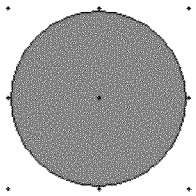
FIG. 1 is a schematic diagram of a micrometersized opaque circular mask pattern.
Figure 2A:
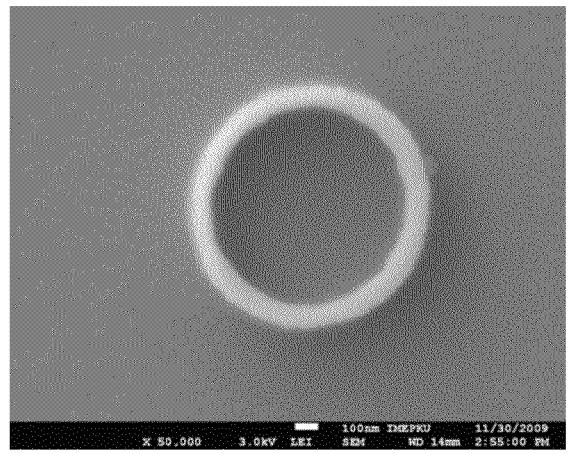
Figure 2B:
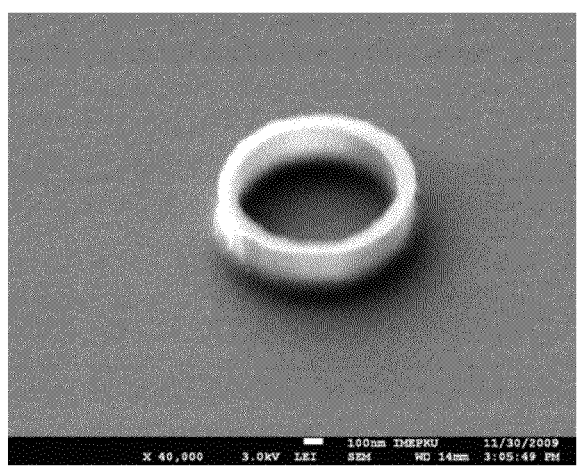

A Si nano circular ring is fabricated by the following steps:
1) A Si substrate is prepared and cleaned.
2) The Si substrate is pre-baked.
3) A positive photoresist RZJ 304-25 with a thickness of 1.7 µm is spin-coated on the Si substrate.
4) An ultraviolet exposure by a wavelength of 365 nm is performed on the Si substrate for 9 s under a protection of a mask, wherein, a pattern region of the mask is a opaque micrometer-sized circle, as shown in FIG. 1. A diameter of the circle takes values of 1 µm, 1.5 µm and 2 µm, respectively.
5) A development is performed on the exposed photoresist. The method of an embodiment of the present invention is based on the Poisson Diffraction principle, that is, when a light illuminates a small opaque circular plate, a bright spot, which is a so-called poisson bright spot, may occur in the center of a shadow of the circular plate. In the above step 3), since the pattern region of the mask is an opaque circle, in order for the occurring of poisson bright spot phenomenon during exposing so that the corresponding photoresist region under the center of the opaque circular mask is also exposed to ensure a circular ring shaped photoresist but not a circle shaped photoresist is left on the substrate after developing, the diameter of the circle should not be too large and it is needed to be selected according to the wavelength of the exposure light. Meanwhile, the diameter of the circle is further limited by the sensitivity of the photoresist, and if the diameter is too small, the photoresist may completely disappear after being developed. Finally, it is founded that, a photoresist pattern corresponding to a circular mask pattern with a diameter of 2 µm is still circular, due to the limitation of the sensitivity of the photoresist. A photoresist pattern corresponding to a circular mask pattern with a diameter of 1 µm completely disappears after being exposed. Therefore, for a common positive photoresist (for example, a positive photoresist RZJ 304-25), the ultraviolet exposure is performed by a ultraviolet lithography equipment, and the diameter d of the circle of the mask is preferably in a range of 1 µm<d<2 µm;
6) A plasma etching is performed on the Si substrate material under protection of the circular ring-shaped photoresist.
7) The photoresist is removed and cleaned to form a nano-sized circular ring structure with a wall thickness of about 100 nm on the surface of the Si substrate, as shown in FIGS. 2(a) and 2(b).

In the above step 1), the material of the substrate is Si, but the material of the substrate may also be other typical semiconductor materials in the field of microelectronics and optoelectronics, for example the material usually used as a device substrate such as Si, Ge, GaAs, etc, and may also be various epitaxialy grown semiconductor materials such as GaN, etc.

Moreover, in the above step 3), the positive photoresist RZJ 304-25 is used, but other positive photoresists such as ARP 3100, ARP 3200, AR-P 3500, ARP 5900/4, etc. may also be used. Also, the thickness of the photoresist is preferably 300 nanometers-4 micrometers, and more preferably 1 micrometers-3 micrometers.

In embodiments of the present invention, it is preferred to use an ultraviolet light in the range of 10 nm-400 nm to perform the exposure, and in the step 4), the exposure is performed by using an ultraviolet light with a wavelength of 365 nm.

Moreover, when the exposure is performed by using an ultraviolet light with a wavelength in the range of 10 nm-400 nm and the diameter d of the circle of the mask is 1 µm<d<2 µm, the outer diameter of the semiconductor circular ring formed by the above steps is 1.5 micrometers-2 micrometers, and the wall thickness of the ring (i.e. a difference between the outer diameter and the inner diameter) is about 80 nanometers-120 nanometers.

What is claimed is:

1. A method for fabricating a semiconductor nano circular ring, comprising:
   1) cleaning a semiconductor substrate and pre-baking the substrate;
   2) spin-coating a positive photoresist on the substrate;
   3) exposing the photoresist under a protection of a mask, wherein a pattern region of the mask is a circle with a micrometer-sized diameter;
   4) developing an exposed photoresist to form a circular ring-shaped photoresist on the substrate, and then post-baking the substrate;
   5) performing a plasma etching on the substrate under protection of the circular ring-shaped photoresist;
   6) removing remained photoresist and performing a cleaning to form a circular ring-shaped structure with a nano-sized wall thickness on a surface of the substrate.

2. The method according to claim 1, characterized in that, in the step 1), a material of the substrate is Si, Ge, GaAs or GaN.

3. The method according to claim 1, characterized in that, in the step 2), the positive photoresist is RZJ 304-25, AR-P 3100, AR-P 3200, AR-P 3500 or AR-P 5900/4.

4. The method according to claim 1, characterized in that, in the step 2), the positive photoresist spin-coated has a thickness of 300 namometers-4 micrometers.

5. The method according to claim 4, characterized in that, in the step 2), the positive photoresist spin-coated has a thickness of 1 micrometers-3 micrometers.

6. The method according to claim 1, characterized in that, in the step 4), an ultraviolet exposure is performed by a ultraviolet lithography equipment, and the pattern region of the mask is a circle with a diameter in the range of 1µ<d<2 µm.

7. The method according to claim 6, characterized in that, an ultraviolet light in the ultraviolet exposure has a wavelength of 365 nm, and the pattern region of the mask is a circle with a diameter of 1.5 µm.

* * * * *